(12) United States Patent
Lee et al.

(10) Patent No.: US 11,844,278 B2
(45) Date of Patent: Dec. 12, 2023

(54) THERMOELECTRIC ELEMENT

(71) Applicant: LG INNOTEK CO., LTD., Seoul (KR)

(72) Inventors: Seung Hwan Lee, Seoul (KR); Se Woon Lee, Seoul (KR); In Seok Kang, Seoul (KR); Sung Chul Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1 day.

(21) Appl. No.: 17/424,574

(22) PCT Filed: Jan. 23, 2020

(86) PCT No.: PCT/KR2020/001194
§ 371 (c)(1),
(2) Date: Jul. 21, 2021

(87) PCT Pub. No.: WO2020/153799
PCT Pub. Date: Jul. 30, 2020

(65) Prior Publication Data
US 2022/0085267 A1 Mar. 17, 2022

(30) Foreign Application Priority Data
Jan. 23, 2019 (KR) .................. 10-2019-0008471
Jan. 23, 2019 (KR) .................. 10-2019-0008472

(51) Int. Cl.
*H10N 10/817* (2023.01)
*H10N 10/17* (2023.01)
(Continued)

(52) U.S. Cl.
CPC ........... *H10N 10/817* (2023.02); *H10N 10/17* (2023.02); *H10N 10/854* (2023.02); *H10N 10/856* (2023.02)

(58) Field of Classification Search
CPC ......... H01L 35/08; H01L 35/20; H01L 35/24; H01L 35/32; H10N 10/17; H10N 10/817; H10N 10/854; H10N 10/856
See application file for complete search history.

(56) References Cited

U.S. PATENT DOCUMENTS

| 7,444,822 B2 * | 11/2008 | Takahashi ............... F25B 21/04 62/3.2 |
| 2016/0005948 A1 | 1/2016 | Hayashi et al. |
| 2020/0136005 A1 * | 4/2020 | Sun .......................... H01L 35/32 |

FOREIGN PATENT DOCUMENTS

| CN | 101794766 | | 8/2010 | |
| JP | 2008130813 | * | 6/2008 | ............. H01L 35/32 |

(Continued)

OTHER PUBLICATIONS

Machine translation of KR101503307 (Year: 2015).*
(Continued)

*Primary Examiner* — Tamir Ayad
(74) *Attorney, Agent, or Firm* — KED & ASSOCIATES, LLP

(57) ABSTRACT

A thermoelectric element of the present invention comprises a first metal substrate, a first resin layer, a plurality of first electrodes, a plurality of P-type thermoelectric legs and a plurality of N-type thermoelectric legs, a plurality of second electrodes, a second resin layer, and a second metal substrate, wherein the first metal substrate is a low-temperature portion, the second metal substrate is a high-temperature portion, the second resin layer comprises a first layer and a second layer arranged on the first layer, the first and second layers include a silicon (Si)-based resin, and the bonding strength of the first resin layer is higher than the bonding strength of the second resin layer.

6 Claims, 12 Drawing Sheets

(51) Int. Cl.
   *H10N 10/854*   (2023.01)
   *H10N 10/856*   (2023.01)

(56) References Cited

FOREIGN PATENT DOCUMENTS

| | | | | |
|---|---|---|---|---|
| JP | 2008-182160 | | 8/2008 | |
| JP | 2010-109132 | | 5/2010 | |
| JP | 2013002849 A | * | 1/2013 | |
| JP | 5525173 | | 6/2014 | |
| KR | 10-1195674 | | 10/2012 | |
| KR | 10-2013-0073554 | | 7/2013 | |
| KR | 101503307 | * | 3/2015 | ........... H05K 9/0081 |
| KR | 10-2018-0059830 | | 6/2018 | |

OTHER PUBLICATIONS

Machine translation of JP2008130813 (Year: 2008).*
Machine translation—Enomoto et al., JP 2013002849 A (Year: 2013).*
Dowsil™ TC-5026 Thermally Conductive Compound Technical Data Sheet (Year: 2017).*
International Search Report dated May 6, 2020 issued in Application No. PCT/KR2020/001194.
Korean Office Action dated Mar. 21, 2023 issued in Application No. 10-2019-0008471.
Korean Office Action dated Mar. 21, 2023 issued in Application No. 10-2019-0008472.
Chinese Office Action dated Apr. 19, 2023 issued in Application No. 202080010298.8.

* cited by examiner

[FIG. 1]
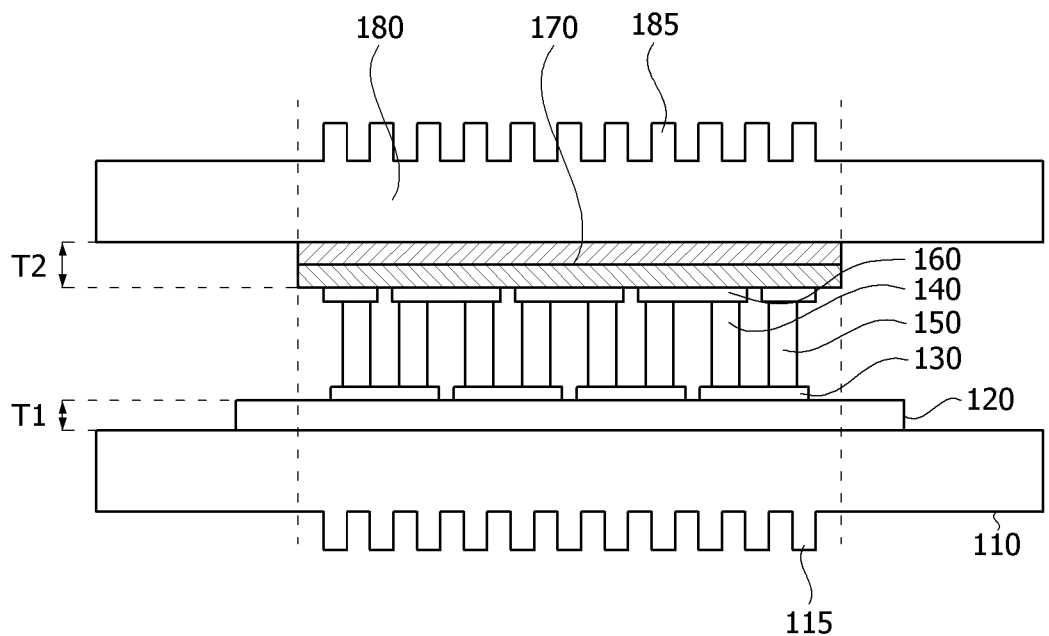
[FIG. 2]
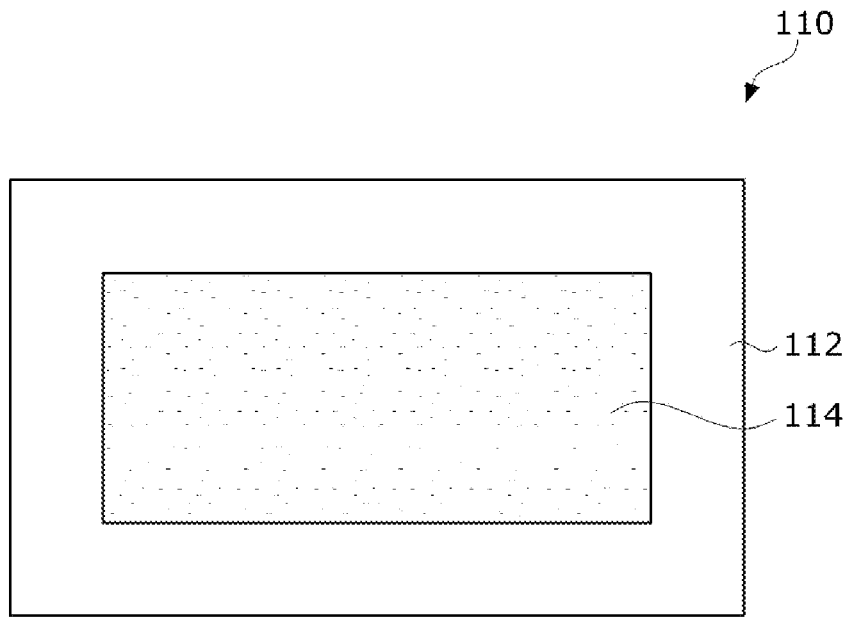

[FIG. 3]
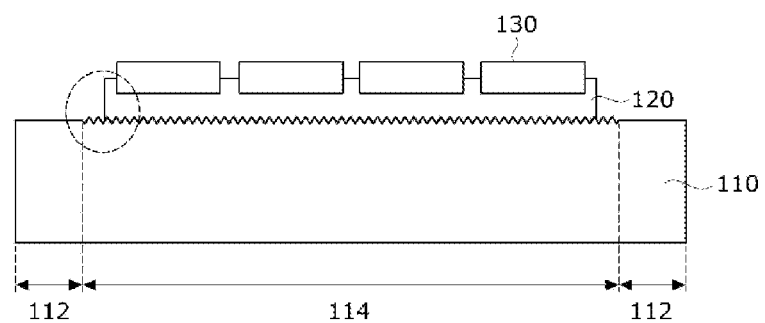
[FIG. 4]
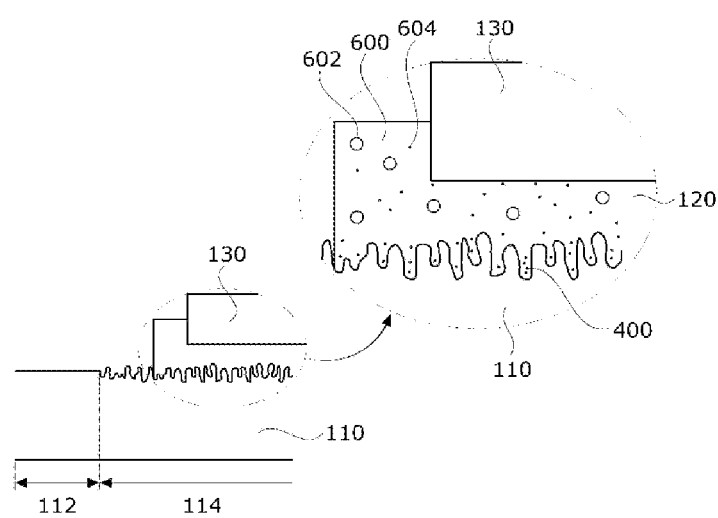

【FIG. 5】
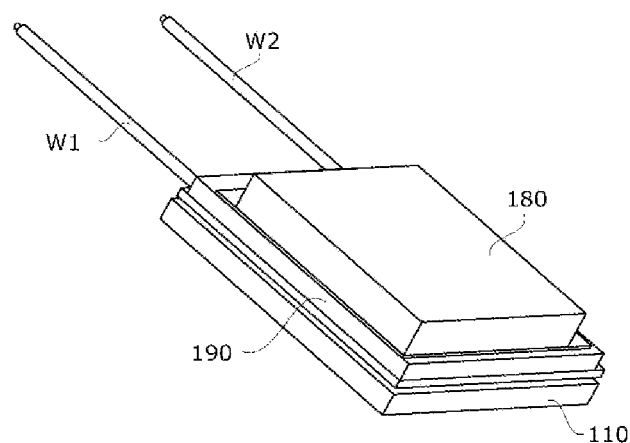

[FIG. 6]
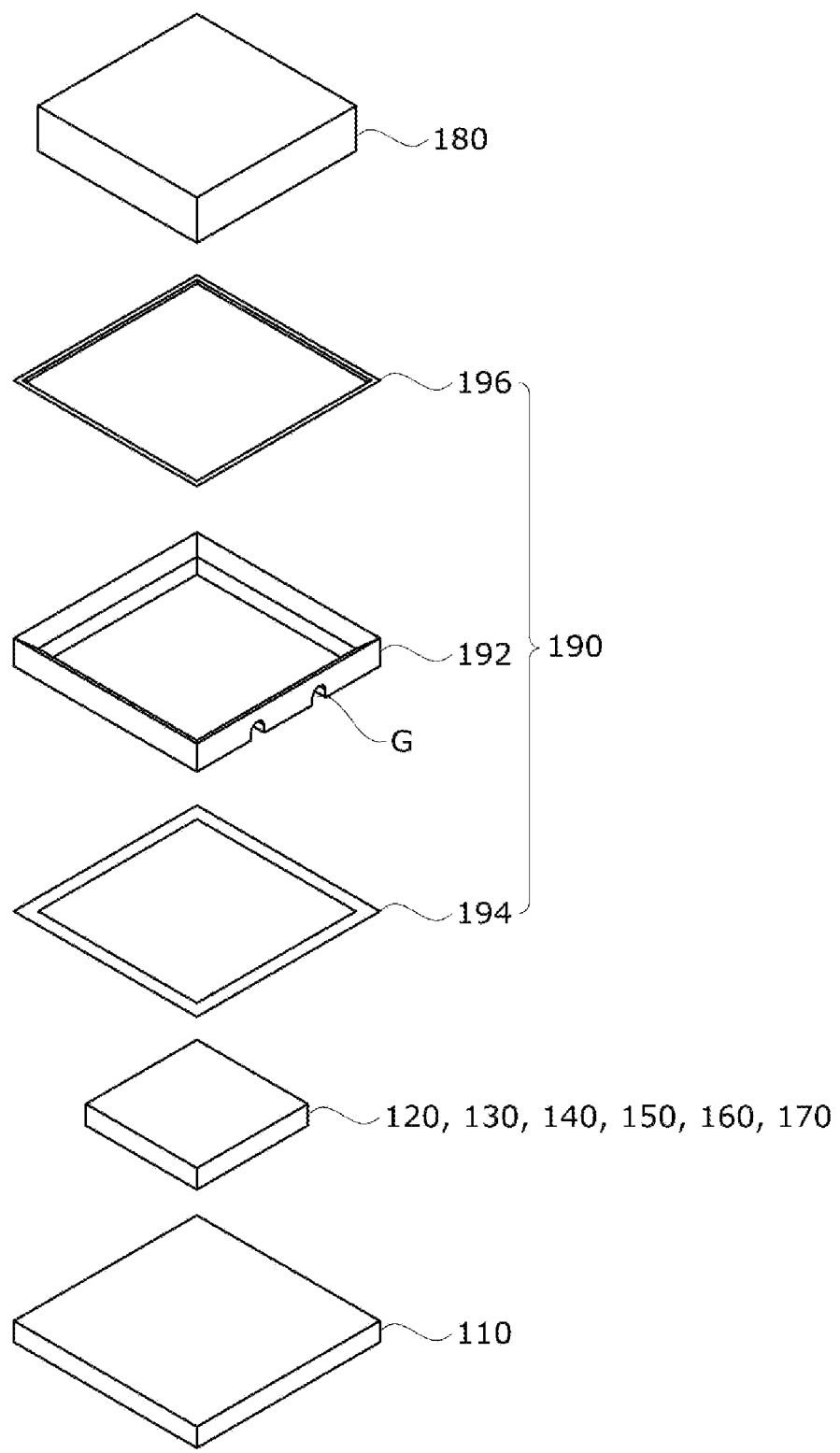

【FIG. 7】
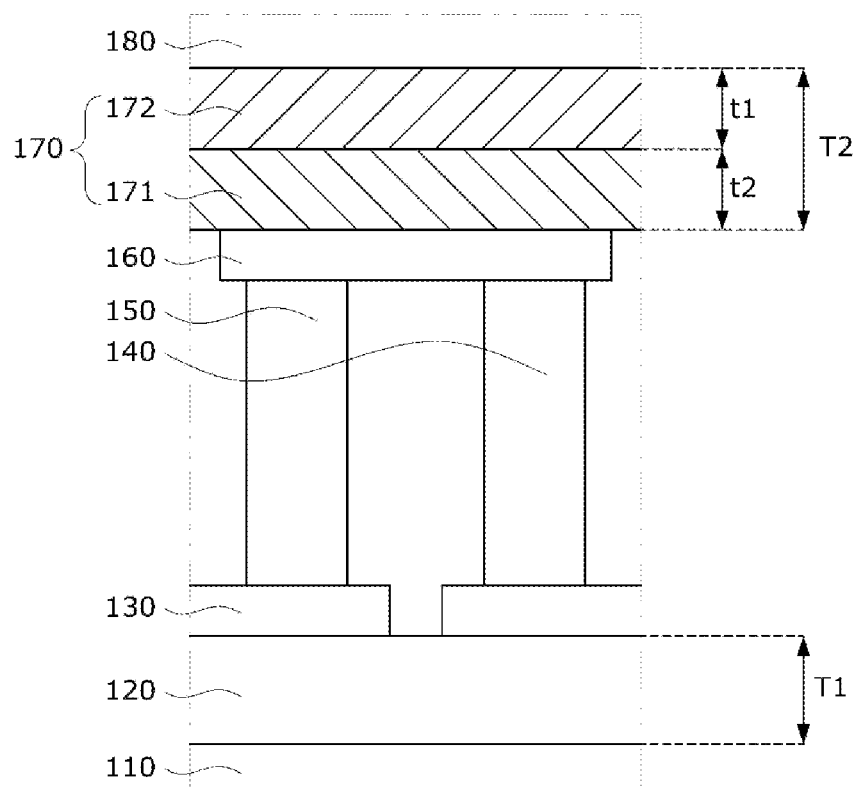
【FIG. 8】
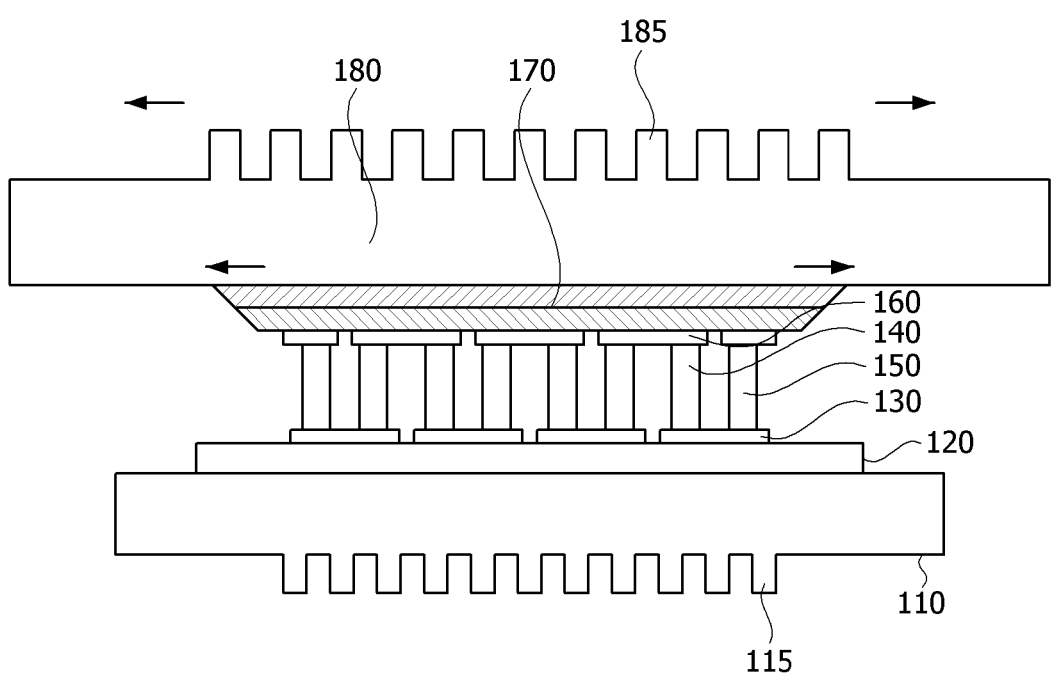

[FIG. 9]
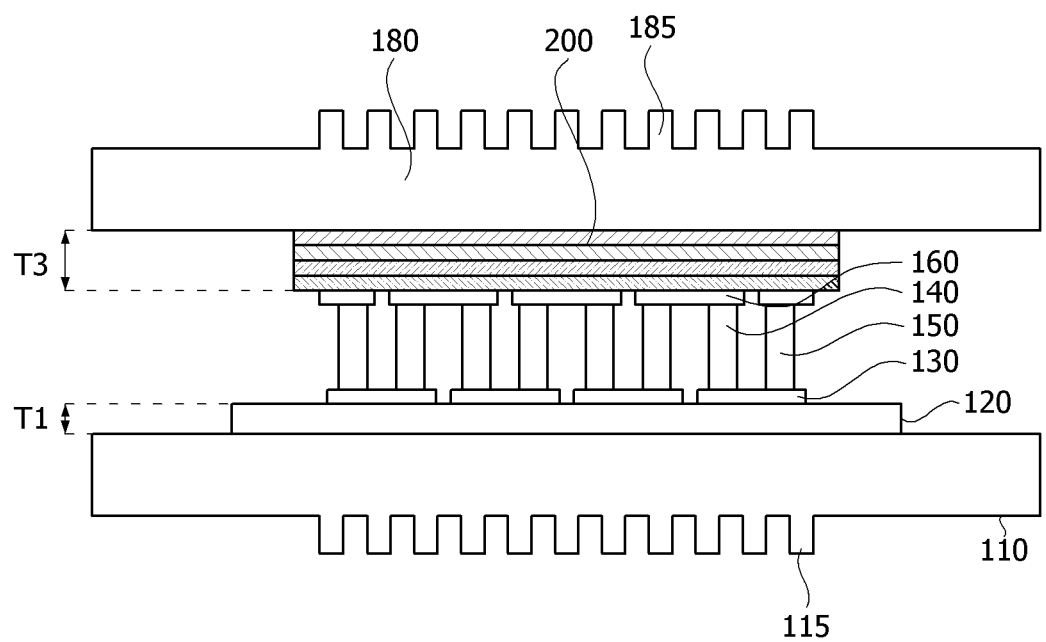

[FIG. 10]
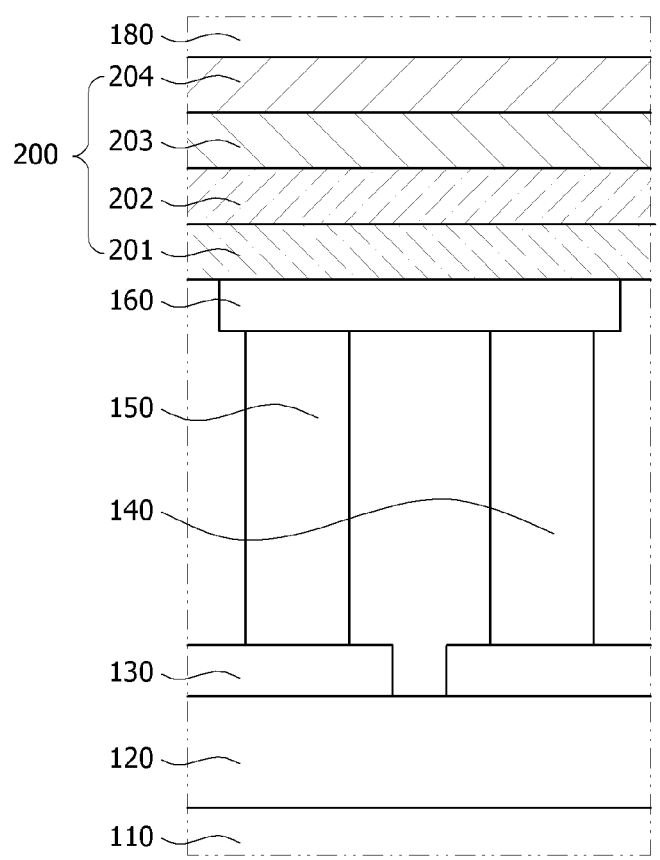

[FIG. 11]
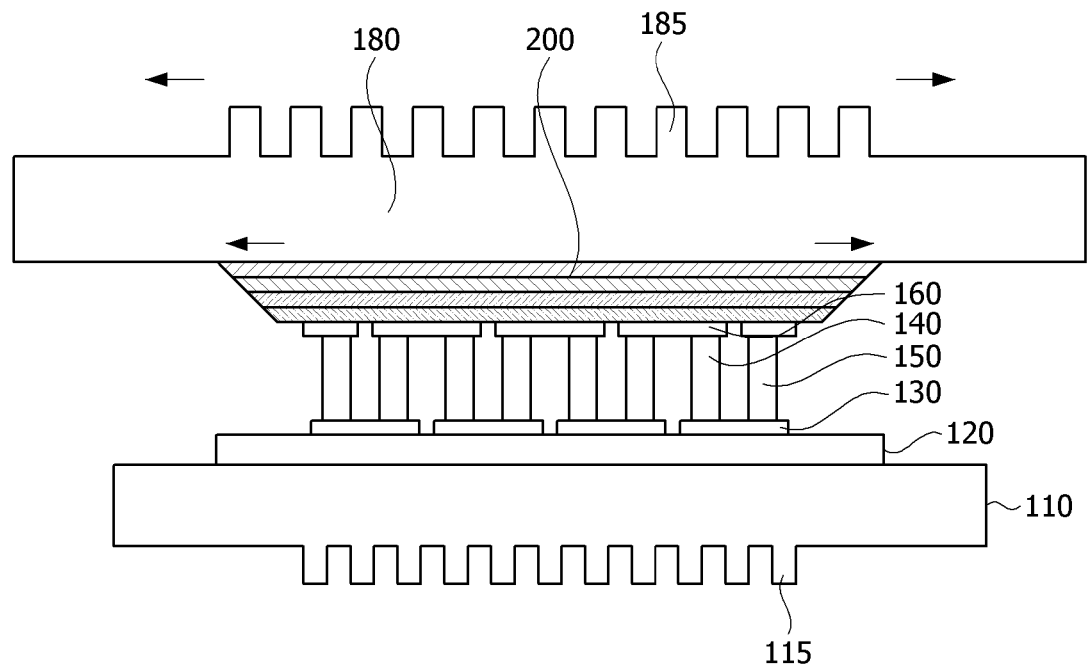
[FIG. 12]
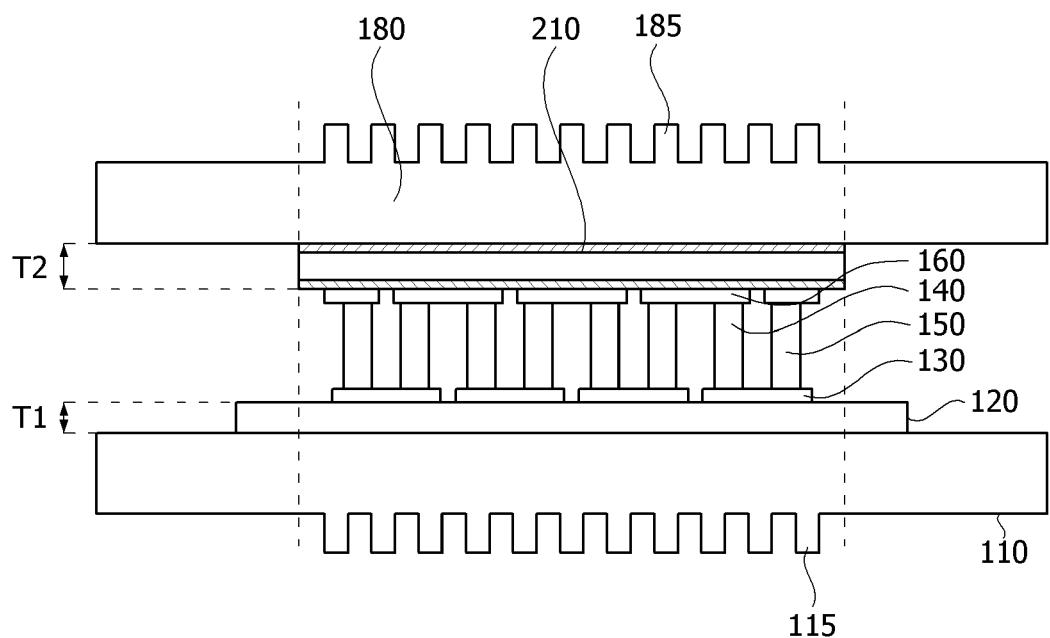

[FIG. 13]
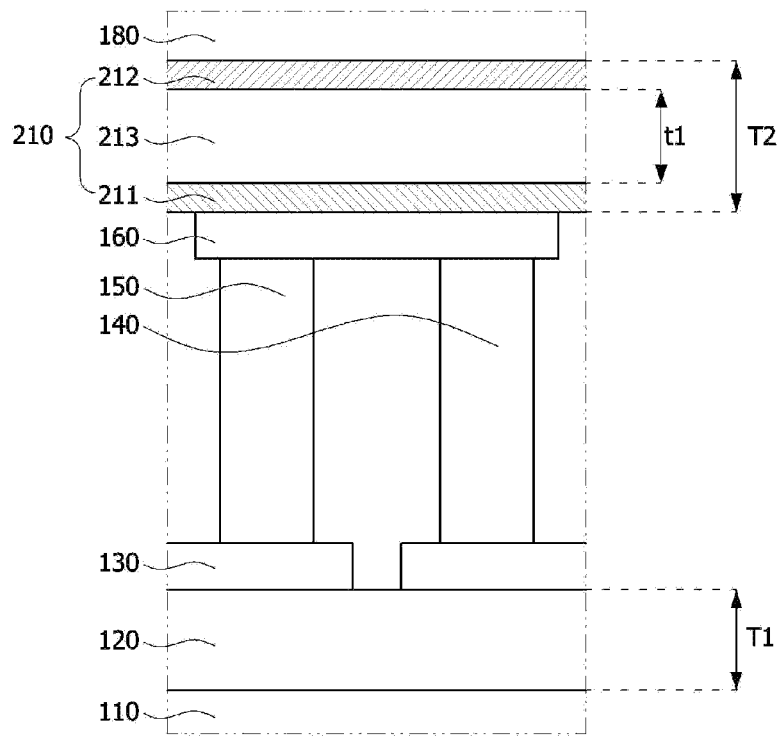
[FIG. 14]
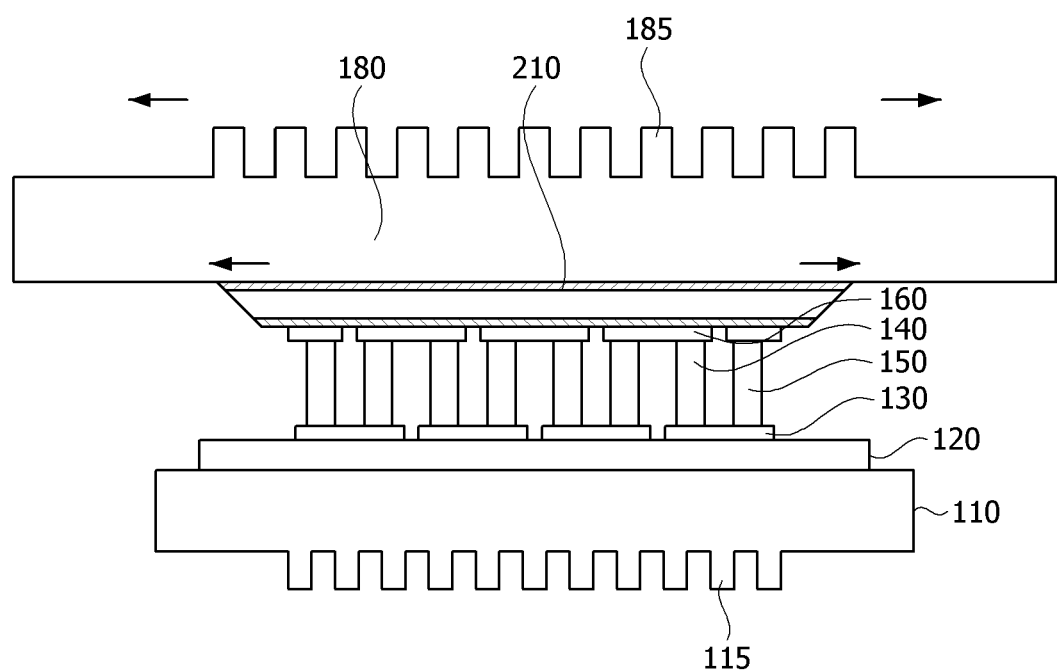

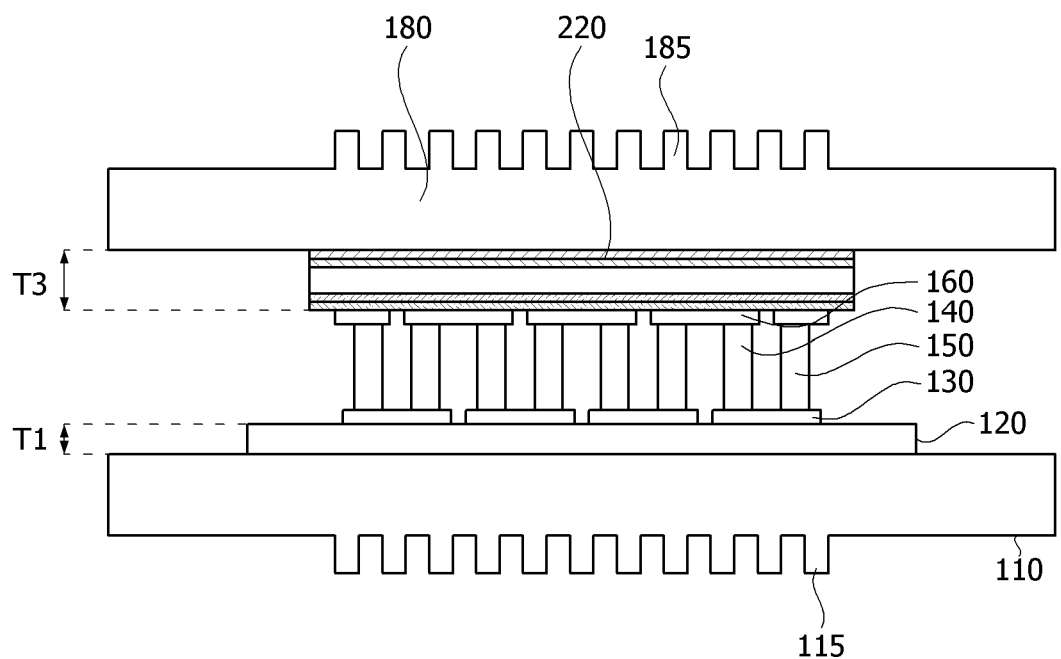
[FIG. 15]

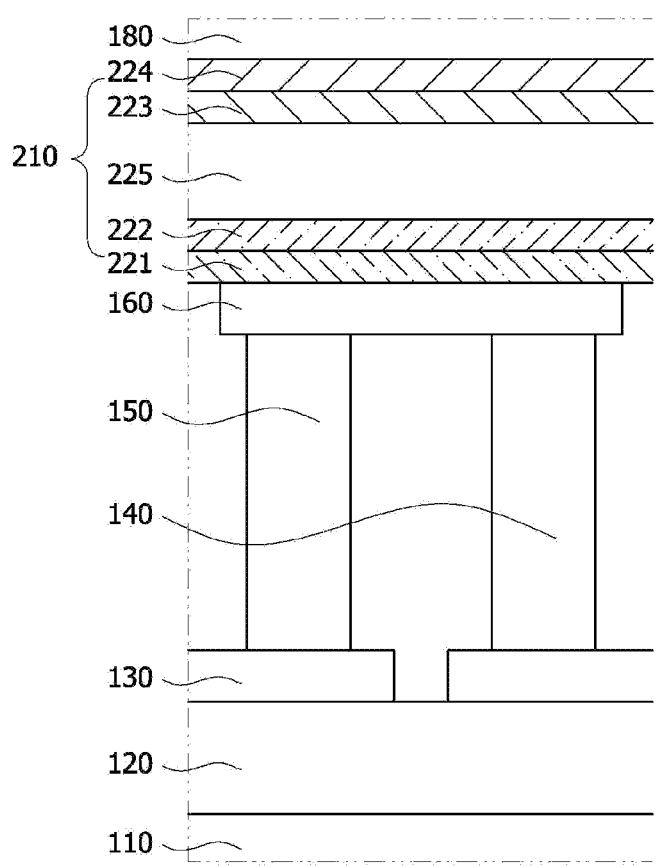
[FIG. 16]

[FIG. 17]
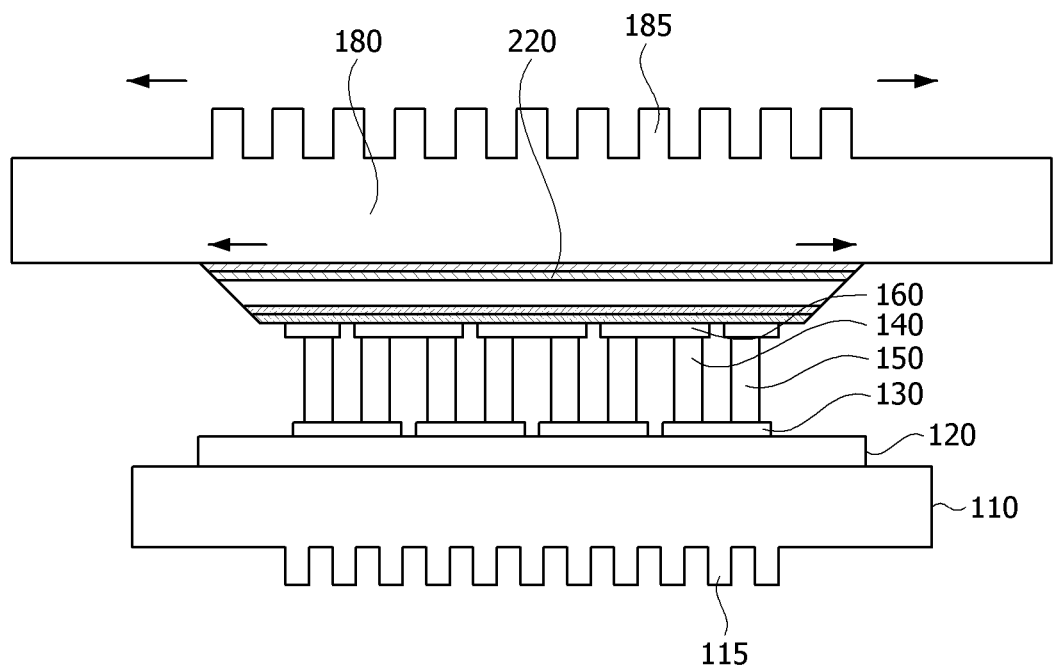
[FIG. 18]
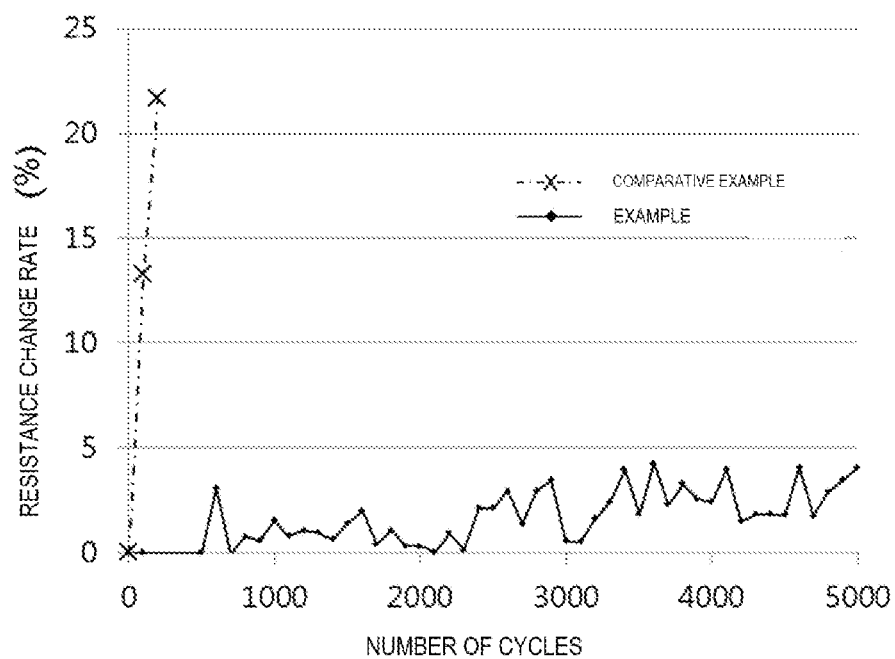

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2020/001194, filed Jan. 23, 2020, which claims priority to Korean Patent Application Nos. 10-2019-0008471 and 10-2019-0008472, both filed Jan. 23, 2019, whose entire disclosures are hereby incorporated by reference.

TECHNICAL FIELD

The present invention relates to a thermoelectric element, and more specifically, to a bonding structure of a thermoelectric element.

BACKGROUND ART

A thermoelectric phenomenon is a phenomenon which occurs due to movement of electrons and holes in a material and refers to direct energy conversion between heat and electricity.

A thermoelectric element is a generic term for a device using the thermoelectric phenomenon and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like. The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

The thermoelectric element includes substrates, electrodes, and thermoelectric legs, wherein a plurality of thermoelectric legs are disposed in an array form between an upper substrate and a lower substrate, a plurality of upper electrodes are disposed between the plurality of thermoelectric legs and the upper substrate, and a plurality of lower electrodes are disposed between the plurality of thermoelectric legs and the lower substrate. In this case, one of the upper substrate and the lower substrate may be a low-temperature portion, and the other may be a high-temperature portion. When the thermoelectric element is applied to a power generation device, power generation performance increases as a temperature difference between the low-temperature portion and the high-temperature portion increases. Accordingly, a temperature of the high-temperature portion may rise to 200° C. or higher. When the temperature of the high-temperature portion is 200° C. or higher, mechanically high shear stress is transferred between the leg and a solder due to a difference in coefficient of thermal expansion between the substrate of the high-temperature portion and the electrode. In this case, in order to alleviate the shear stress applied between the leg and the solder, a bonding layer between the substrate and the electrode may be formed to have a predetermined thickness or more. However, as the thickness of the bonding layer increases, thermal resistance decreases, and thus a problem in that the power generation performance of the thermoelectric element decreases occurs. Further, when the substrate is overheated and expanded, the bonding layer has a limitation in alleviating shear stress, and there is a problem in that cracks are generated in a soldered portion.

DISCLOSURE

Technical Problem

The present invention is directed to providing a bonding structure of a thermoelectric element.

Technical Solution

A thermoelectric element according to an embodiment of the present invention includes: a first metal substrate; a first resin layer disposed on the first metal substrate; a plurality of first electrodes disposed on the first resin layer; a plurality of P-type thermoelectric legs and a plurality of N-type thermoelectric legs disposed on the plurality of first electrodes; a plurality of second electrodes disposed on the plurality of P-type thermoelectric legs and the plurality of N-type thermoelectric legs; a second resin layer disposed on the plurality of second electrodes; and a second metal substrate disposed on the second resin layer, wherein the first metal substrate is a low-temperature portion, the second metal substrate is a high-temperature portion, the second resin layer includes a first layer which comes into direct contact with the plurality of second electrodes and a second layer which is disposed on the first layer and comes into direct contact with the second metal substrate, the first layer and the second layer include a silicon (Si)-based resin, and a bonding strength of the first resin layer is higher than a bonding strength of the second resin layer.

At least one of the first metal substrate and the second metal substrate may include aluminum.

A thickness of the second resin layer may be larger than or equal to a thickness of the first resin layer.

A ratio of the thickness of the second resin layer to the thickness of the first resin layer may be 1 to 5.

The first layer may include polydimethylsiloxane (PDMS) and aluminum oxide, and the second layer may include polydimethylsiloxane (PDMS) and silver (Ag).

The thermal conductivity of the first layer may be lower than the thermal conductivity of the second layer.

The electrical resistance of the first layer may be higher than the electrical resistance of the second layer.

The thermal conductivity of the first layer may range from 1.5 to 3.5 W/mK, and the thermal conductivity of the second layer may range from 6.0 to 10.0 W/mK.

A ratio of the thickness of the second layer to the thickness of the first layer may be 0.2 to 2.5.

The thermoelectric element may further include a polyimide layer disposed between the first layer and the second layer, wherein the first layer and the second layer may include a polysiloxane-based resin.

The first layer and the second layer may have a bonding strength of 1 kgf/mm2 or less at a temperature of 150 to 200° C.

The thermoelectric element may further include a third layer between the first layer and the polyimide layer.

The thermoelectric element may further include a fourth layer between the second layer and the polyimide layer.

The thermal conductivity of each of the first to fourth layers may increase the closer each of the first to fourth layers is to the second metal substrate.

The other of the at least one of the first metal substrate and the second metal substrate may include copper (Cu).

Advantageous Effects

According to an embodiment of the present invention, shear stress applied to a soldered portion of a leg can be alleviated, and durability of a thermoelectric element at high temperatures can be increased by securing a thickness of a bonding layer between a substrate and an electrode. At the same time, since a portion of the bonding layer bonded to the substrate is composed of a material having excellent conductivity, a phenomenon in which thermal conductivity is lowered as the thickness of the bonding layer increases can be prevented, and power generation performance of the thermoelectric element can be maintained.

According to an embodiment of the present invention, a phenomenon in which mechanical shear stress is transferred to a soldered portion of a leg due to thermal expansion of a substrate can be effectively blocked by bonding between the substrate and an electrode with a material having adhesiveness.

Further, according to an embodiment of the present invention, shear stress applied to a soldered portion of a leg can be alleviated, and the durability of a thermoelectric element at high temperatures can be increased by securing the thickness of a bonding layer between a substrate and an electrode. At the same time, since the portion of the bonding layer bonded to the substrate is composed of a material having excellent conductivity, a phenomenon in which thermal conductivity is lowered as the thickness of the bonding layer increases can be prevented, and the power generation performance of the thermoelectric element can be maintained.

DESCRIPTION OF DRAWINGS

FIG. 1 is a cross-sectional view of a thermoelectric element according to a first embodiment of the present invention.

FIG. 2 is a top view of a first metal substrate included in the thermoelectric element according to the first embodiment of the present invention.

FIG. 3 is a side view of the first metal substrate included in the thermoelectric element according to the first embodiment of the present invention.

FIG. 4 is a partially enlarged view of FIG. 3.

FIG. 5 is a perspective view of the thermoelectric element according to the first embodiment of the present invention.

FIG. 6 is an exploded perspective view of the thermoelectric element according to the first embodiment of the present invention.

FIG. 7 is a partially enlarged view of the thermoelectric element according to the first embodiment of the present invention.

FIG. 8 is a view illustrating a state in which the thermoelectric element according to the first embodiment of the present invention generates power.

FIG. 9 is a cross-sectional view of a thermoelectric element according to a second embodiment of the present invention.

FIG. 10 is a partially enlarged view of FIG. 9.

FIG. 11 is a view illustrating a state in which power is applied to the thermoelectric element according to the second embodiment of the present invention.

FIG. 12 is a cross-sectional view of a thermoelectric element according to a third embodiment of the present invention.

FIG. 13 is a partially enlarged view of the thermoelectric element according to the third embodiment of the present invention.

FIG. 14 is a view illustrating a state in which the thermoelectric element according to the third embodiment of the present invention generates power.

FIG. 15 is a cross-sectional view of a thermoelectric element according to a fourth embodiment of the present invention.

FIG. 16 is a partially enlarged view of FIG. 15.

FIG. 17 is a view illustrating a state in which power is applied to the thermoelectric element according to the fourth embodiment of the present invention.

FIG. 18 is a graph illustrating a change rate of resistance according to the number of cycles in a temperature cycle test of a third Example and a Comparative Example.

MODES OF THE INVENTION

Hereinafter, preferred embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C".

Further, terms such as first, second, A, B, (a), (b), and the like may be used to describe elements of the embodiments of the present invention.

The terms are only provided to distinguish an element from other elements, and the essence, sequence, order, or the like of the elements are not limited by the terms.

Further, when a particular element is disclosed as being "connected," "coupled," or "linked" to another element, this may not only include a case of the element being directly connected, coupled, or linked to the other element but also a case of the element being connected, coupled, or linked to the other element by another element between the element and the other element.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included based on one element.

FIG. 1 is a cross-sectional view of a thermoelectric element according to a first embodiment of the present invention, FIG. 2 is a top view of a first metal substrate included in the thermoelectric element according to the first embodiment of the present invention, FIG. 3 is a side view of the first metal substrate included in the thermoelectric element according to the first embodiment of the present invention, FIG. 4 is a partially enlarged view of FIG. 3, FIG. 5 is a perspective view of the thermoelectric element according to the first embodiment of the present invention, and FIG. 6 is an exploded perspective view of the thermoelectric element according to the first embodiment of the present invention.

Referring to FIGS. 1 to 6, the thermoelectric element includes a first metal substrate 110, a first resin layer 120, a plurality of first electrodes 130, a plurality of P-type thermoelectric legs 140, a plurality of N-type thermoelectric legs 150, a plurality of second electrodes 160, a second resin layer 170, a second metal substrate 180, and a sealing means 190.

The first metal substrate 110 is formed in a plate shape. The first metal substrate 110 is spaced apart from each other to face the second metal substrate 180. The first metal substrate 110 may be made of aluminum, an aluminum alloy, copper, or a copper alloy. Specifically, the first metal substrate 110 may be made of aluminum. In this case, when a voltage is applied to the thermoelectric element, the first metal substrate 110 absorbs heat according to the Peltier effect to act as a low-temperature portion, and the second metal substrate 180 radiates heat to act as a high-temperature portion.

Meanwhile, when different temperatures are applied to the first metal substrate 110, electrons in a high-temperature region move to a low-temperature region due to a temperature difference, and thus thermoelectric power is generated. This is referred to as the Seebeck effect, and electricity is generated in a circuit of the thermoelectric element by thermoelectric power resulting from this.

Here, the first metal substrate 110 may come into direct contact with the first resin layer 120. To this end, in the first metal substrate 110, surface roughness may be entirely or partially formed on a surface on which the first resin layer 120 is disposed, that is, a surface of the first metal substrate 110 facing the first resin layer 120 among both surfaces. Accordingly, it is possible to prevent a problem in that the first resin layer 120 is lifted during thermal compression bonding between the first metal substrate 110 and the first resin layer 120. In the specification, the surface roughness refers to unevenness, and may be interchanged with surface unevenness.

Referring to FIGS. 2 to 4, the surface on which the first resin layer 120 is disposed among both surfaces of the first metal substrate 110, that is, the surface of the first metal substrate 110 facing the first resin layer 120 may include a first region 112 and a second region 114, and the second region 114 may be disposed in the first region 112. That is, the first region 112 may be disposed within a predetermined distance from an edge of the first metal substrate 110 toward a center region, and may surround the second region 114.

In this case, the surface roughness of the second region 114 may be larger than the surface roughness of the first region 112, and the first resin layer 120 may be disposed on the second region 114. Here, the first resin layer 120 may be disposed to be spaced apart by a predetermined distance from a boundary between the first region 112 and the second region 114. That is, the first resin layer 120 may be disposed on the second region 114, and an edge of the first resin layer 120 may be located in the second region 114. Accordingly, in at least a part of a groove 400 formed by the surface roughness of the second region 114, a part of the first resin layer 120, that is, 120, and parts 604 of an inorganic filler and an epoxy resin 600 included in the first resin layer may permeate, and adhesion between the first resin layer 120 and the first metal substrate 110 may increase.

However, the surface roughness of the second region 114 may be larger than the particle size (D50) of a part of the inorganic filler included in the first resin layer 120 and smaller than the particle size (D50) of the other part of the inorganic filler. Here, the particle size (D50) may refer to a particle diameter corresponding to 50% of a weight percentage in a particle size distribution curve, that is, a particle diameter at which a passing mass percentage becomes 50%, and may be interchanged with an average particle diameter. In an example in which the first resin layer 120 includes aluminum oxide and boron nitride as inorganic fillers, the aluminum oxide does not affect the adhesion performance between the first resin layer 120 and the first metal substrate 110, but the boron nitride has a smooth surface, and thus adhesion performance between the first resin layer 120 and the first metal substrate 110 may be adversely affected. Accordingly, when the surface roughness of the second region 114 is formed to be larger than the particle size (D50) of the aluminum oxide included in the first resin layer 120, and smaller than the particle size (D50) of the boron nitride, since only the aluminum oxide is disposed in the grooves formed by the surface roughness of the second region 174, and the boron nitride is difficult to be disposed in the grooves, the first resin layer 120 and the first metal substrate 110 may maintain high bonding strength.

The surface roughness may be measured using a surface roughness meter. The surface roughness meter may measure a cross-sectional curve using a probe, and calculate the surface roughness using a peak line, a valley bottom line, an average line, and a reference length of the cross-sectional curve. In this specification, the surface roughness may refer to an arithmetic average roughness (Ra) by a center line average calculation method. The arithmetic average roughness (Ra) may be obtained through the following Equation 1.

$$R_a = \frac{1}{L}\int_0^L |f(x)|dx \qquad \text{[Equation 1]}$$

That is, when the cross-sectional curve obtained by the probe of the surface roughness meter is extracted as much as a reference length L and expressed as the function (f(x)) with an average line direction set to an x-axis and a height direction set to a y-axis, the value obtained by Equation 2 may be expressed in micrometers.

In this case, although not shown in the drawings, the surface roughness corresponding to the second region 114 can be formed on the entire surface of first metal substrate 110. Further, the surface roughness formed on the first metal substrate 110 may be equally applied to the second metal substrate 180 to be described below.

The first resin layer 120 is disposed on the first metal substrate 110. The first resin layer 120 as formed to have a smaller area than the first metal substrate 110. Accordingly, the first resin layer 120 may be disposed in a region spaced apart from the edge of the first metal substrate 110 by a predetermined distance.

The first resin layer 120 may be made of an epoxy resin composition including an epoxy resin and an inorganic filler, or may be made of a silicone resin composition including polydimethylsiloxane (PDMS).

Here, the inorganic filler may be included in an amount of 68 to 88 vol % of the epoxy resin composition. When the inorganic filler is included in an amount less than 68 vol %, a heat conduction effect may be low, and when the inorganic filler is included in an amount greater than 88 vol %, adhesion between the resin layer and the metal substrate may be lowered, and the resin layer may be easily broken.

The epoxy resin may include an epoxy compound and a curing agent. In this case, it may be included in a volume ratio of 1 to 10 with respect to a volume ratio of 10 of the epoxy compound. Here, the epoxy compound may include at least one of a crystalline epoxy compound, an amorphous epoxy compound, and a silicone epoxy compound. The crystalline epoxy compound may include a mesogen structure. A mesogen is a basic unit of liquid crystal and includes a rigid structure. Further, the amorphous epoxy compound may be a general amorphous epoxy compound having two or more epoxy groups in a molecule and may be, for example, glycidyl ethers derived from bisphenol A or bisphenol F. Here, the curing agent may include at least one of an amine-based curing agent, a phenolic curing agent, an acid anhydride-based curing agent, a polymercaptan-based curing agent, a polyaminoamide-based curing agent, an isocyanate-based curing agent, and a block isocyanate-based curing agent, and two or more types of curing agents may be mixed and used.

The inorganic filler may include an aluminum oxide and a nitride, and the nitride may be included in an amount of 55 to 95 wt % of the inorganic filler, and more preferably, 60 to 80 wt %. When the nitride is included in this numerical range, thermal conductivity and bonding strength may be improved. Here, the nitride may include at least one of boron nitride and aluminum nitride. Here, the boron nitride may be a plate-shaped boron nitride or a boron nitride agglomerate in which the plate-shaped boron nitride is agglomerated, and a surface of the boron nitride may be coated with a polymer resin. Here, any polymer resin which may be coupled to the boron nitride or may coat the surface of the boron nitride may be used. The polymer resin may be selected from, for example, the group consisting of an acrylic polymer resin, an epoxy polymer resin, a urethane polymer resin, a polyamide polymer resin, a polyethylene polymer resin, an ethylene vinyl acetate copolymer (EVA) polymer resin, a polyester polymer resin, and a polyvinyl chloride (PVC) polymer resin. Further, the polymer resin may be a polymer resin having the following Unit 1.

Unit 1 is as follows.

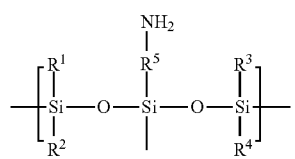

[Unit 1]

Here, one of R1, R2, R3, and R4 may be H, and the others may be selected from the group consisting of C1-C3 alkyls, C2-C3 alkenes, and C2-C3 alkynes, and R5 may be a linear, branched or cyclic divalent organic linker having 1 to 12 carbon atoms.

In one embodiment, one of the remainder among R1, R2, R3, and R4 excluding H may be selected from C2-C3 alkenes, and another and still another of the remainder may be selected from C1-C3 alkyls. For example, the polymer resin according to the embodiment of the present invention may include the following Unit 2.

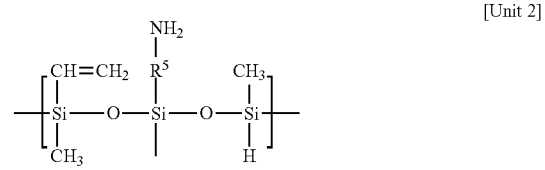

[Unit 2]

Alternatively, the remainder among R1, R2, R3, and R4, excluding H, may be selected from the group consisting of C1-C3 alkyls, C2-C3 alkenes, and C2-C3 alkynes to be different from each other.

Like the above, when the polymer resin according to Unit 1 or Unit 2 is coated on the boron nitride, a functional group may be easily formed, and when the functional group is formed on the boron nitride, affinity with the resin may increase.

Like the above, when the first resin layer 120 is disposed between the first metal substrate 110 and the plurality of first electrodes 130, heat may be transferred between the first metal substrate 110 and the plurality of first electrodes 130 without a separate ceramic substrate, and a separate adhesive or physical fastening means is not required due to the adhesive performance of the first resin layer 120 itself. Specifically, since the first resin layer 120 may be implemented with a significantly thinner thickness compared to a conventional ceramic substrate, it is possible to improve heat transfer performance between the plurality of first electrodes 130 and the first metal substrate 110, and an overall size of the thermoelectric element may also be reduced.

The plurality of first electrodes 130 are disposed on the first resin layer 120. Further, the plurality of P-type thermoelectric legs 140 and the plurality of N-type thermoelectric legs 150 are disposed on the first electrodes 130. In this case, the first electrodes 130 are electrically connected to the P-type thermoelectric legs 140 and the N-type thermoelectric legs 150. Here, the first electrode 130 may include at least one among copper (Cu), aluminum (Al), silver (Ag), and nickel (Ni).

The plurality of P-type thermoelectric legs 140 and the plurality of N-type thermoelectric legs 150 are disposed on the first electrodes 130. In this case, the P-type thermoelectric legs 140 and the N-type thermoelectric legs 150 may be bonded to the first electrodes 130 by soldering.

In this case, the P-type thermoelectric leg 140 and the N-type thermoelectric leg 150 may be bismuth-telluride (Bi—Te)-based thermoelectric legs including bismuth (Bi) and tellurium (Te) as main raw materials. The P-type thermoelectric leg 140 may be a thermoelectric leg including a bismuth-telluride (Bi—Te)-based main raw material in an amount of 99 to 99.999 wt % including at least one among antimony (Sb), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Se—Te, and Bi or Te may be further included in an amount of 0.001 to 1 wt % of the total weight. The N-type thermoelectric leg 150 may be a thermoelectric leg including a bismuth-telluride (Bi—Te)-based main raw material in an amount of 99 to 99.999 wt % including at least one among selenium (Se), nickel (Ni), aluminum (Al), copper (Cu), silver (Ag), lead (Pb), boron (B), gallium (Ga), tellurium (Te), bismuth (Bi), and indium (In), and a mixture in an amount of 0.001 to 1 wt % including Bi or Te based on 100 wt % of the total weight. For example, the main raw material may be Bi—Sb—Te, and Bi or Te may be further included in an amount of 0.001 to 1 wt % of the total weight The P-type thermoelectric legs 140 and the N-type thermoelectric legs 150 may be formed in a bulk type or a stacked type. Generally, the bulk type P-type thermoelectric legs 140 or the bulk type N-type thermoelectric legs 150 may be obtained through a process of producing an ingot by heat-treating a thermoelectric material, pulverizing and sieving the ingot to obtain powder for thermoelectric legs, sintering the powder, and cutting the sintered object. The stacked type P-type thermoelectric legs 140 or the stacked type N-type thermoelectric legs 150 may be obtained through a process of forming a unit member by applying a paste including a thermoelectric material on a sheet-shaped base material, and then stacking and cutting the unit member.

In this case, one pair of the P-type thermoelectric leg 140 and the N-type thermoelectric leg 150 may have the same shape and volume or may have different shapes and volumes. For example, since electrical conduction characteristics of the P-type thermoelectric leg 140 and the N-type thermoelectric leg 150 are different, a height or cross-sectional area of the N-type thermoelectric leg 150 may be formed differently from a height or cross-sectional area of the P-type thermoelectric leg 140.

The performance of the thermoelectric element according to one embodiment of the present invention may be expressed as a thermoelectric performance index. The thermoelectric performance index (ZT) may be expressed as in Equation 2.

$$ZT = \alpha^2 \cdot \sigma \cdot T/k \qquad \text{[Equation 2]}$$

Here, $\alpha$ is the Seebeck coefficient [V/K], $\sigma$ is electrical conductivity [S/m], and $\alpha 2\sigma$ is a power factor [W/mK2]). Further, T is a temperature, and k is thermal conductivity [W/mK]. k may be expressed as $a \cdot cp \cdot \rho$, wherein a is thermal diffusivity [cm2/S], cp is specific heat [J/gK], and $\rho$ is density [g/cm3].

In order to obtain the thermoelectric performance index of the thermoelectric element, a Z value (V/K) is measured using a Z meter, and the thermoelectric performance index (ZT) may be calculated using the measured Z value.

The P-type thermoelectric leg 140 or the N-type thermoelectric leg 150 may have a cylindrical shape, a polygonal pillar shape, an oval pillar shape, or the like. Alternatively, the P-type thermoelectric leg 140 or the N-type thermoelectric leg 150 may have a stacked structure. For example, the P-type thermoelectric leg 140 or the N-type thermoelectric leg 150 may be formed using a method of stacking a plurality of structures in which a semiconductor material is applied on a sheet-shaped base material and then cutting the structures. Accordingly, material loss may be prevented and electrical conduction characteristics may be improved. Alternatively, the P-type thermoelectric leg 140 or the N-type thermoelectric leg 150 may be manufactured according to a zone melting method or a powder sintering method.

According to the zone melting method, the thermoelectric leg is obtained through a method of manufacturing an ingot using a thermoelectric material, refining so that particles are rearranged in a single direction by slowly applying heat to the ingot, and slowly cooling the ingot. According to the powder sintering method, the thermoelectric leg is obtained through a process of manufacturing an ingot using a thermoelectric material, pulverizing and sieving the ingot to obtain powder for thermoelectric legs, and sintering the powder.

The plurality of second electrodes 160 are disposed on the plurality of P-type thermoelectric legs 140 and the plurality of N-type thermoelectric legs 150. In this case, the P-type thermoelectric legs 140 and the N-type thermoelectric legs 150 may be bonded to the second electrodes 160 by soldering. In this case, when stress is applied to a soldered portion by shear, cracks may be formed in the soldered portion. Here, the second electrode 160 may include at least one of copper (Cu), aluminum (Al), silver (Ag), and nickel (Ni).

The second resin layer 170 is disposed on the plurality of second electrodes 160. Further, the second metal substrate 180 is disposed on the second resin layer 170. The second resin layer 170 may be formed to have a smaller area than the second metal substrate 180. Accordingly, the second resin layer 170 may be disposed in a region spaced apart from an edge of the second metal substrate 180 by a predetermined distance.

In this case, the first resin layer 120 and the second resin layer 170 may be formed to have different sizes. For example, a volume, a thickness, or an area of one of the first resin layer 120 and the second resin layer 170 may be formed to be larger than a volume, a thickness, or an area of the other one. When a temperature of a region of the second metal substrate 180 in a Peltier or Seebeck element is higher than a temperature of a region of the first metal substrate 110, the bonding strength between the second resin layer 170 and the plurality of second electrodes 160 or the second metal substrate 180 which comes into direct contact with the second resin layer 170 may be lower than the bonding strength between the first resin layer 120 and the plurality of first electrodes 130 or the first metal substrate 110 which comes into direct contact with the first resin layer 120. The bonding strength between the first resin layer 120 and the plurality of first electrodes 130 or the first metal substrate 110 may be 5 kgf/mm2 or more, preferably, 10 kgf/mm2 or more, and more preferably, 15 kgf/mm2 or more. In contrast, the bonding strength between the second resin layer 170 and the plurality of second electrodes 160 or the second metal substrate 180 may be 1 kgf/mm2 or less.

In this case, a thickness T2 of the second resin layer may be greater than or equal to a thickness T1 of the first resin layer. Preferably, the thickness T1 of the first resin layer 120 may be about 40 μm, and the thickness T2 of the second resin layer 170 may be 40 to 200 μm. That is, a ratio of the thickness T2 of the second resin layer 170 to the thickness T1 of the first resin layer 120 may be 1 to 5.

The second resin layer 170 may prevent a current flow between the second metal substrate 180 and the second electrode 160 while transferring heat generated from the P-type thermoelectric legs 140 and the N-type thermoelectric legs 150 to the second metal substrate 180 or transferring external heat obtained from the second metal substrate 180 to the P-type thermoelectric legs 140 and the N-type thermoelectric legs 150. To this end, a portion of the second resin layer 170 adjacent to the second electrodes 160 may have a relatively high insulating property, and a portion adjacent to the second metal substrate 180 may have relatively high thermal conductivity. In the specification, insulation may refer to an electrical resistance. For example, a meaning of high insulation may be interpreted as meaning high electrical resistance. Further, the first metal substrate 110 and the second metal substrate 180 are shown as being integrally formed with heat dissipation fins 115 and 185, respectively, but are not limited thereto, and at least one of the first metal substrate 110 and the second metal substrate 180 may not have the heat dissipation fin in consideration of thermal characteristics, or may not be integrally formed with the heat dissipation fin. In detail, the first metal substrate 110 may come into contact with the low-temperature region without a first heat dissipation fin 115, and the second metal substrate 180 may be disposed in the high-temperature region by bonding a separate heat dissipation fin without being integrally formed with a second heat dissipation fin 185.

FIG. 7 is a partially enlarged view of the thermoelectric element according to one embodiment of the present invention.

Referring to FIG. 7, the second resin layer 170 includes a first layer 171 and a second layer 172.

The first layer 171 comes into direct contact with the second electrodes 160. The first layer 171 has insulating properties and serves to block a current flowing through the second electrode 160 from being transmitted to the second metal substrate 180. To this end, the first layer 171 may include a matrix resin and an insulating filler. Here, the matrix resin may include polydimethylsiloxane (PDMS). Further, the insulating filler may include ceramic powder such as aluminum oxide, aluminum nitride, boron nitride, or the like. Preferably, the ceramic powder may be included in an amount of 50 to 99 wt %. More preferably, the aluminum oxide powder may be included in an amount of 50 to 99 wt %. In this case, the thermal conductivity of the first layer 171 may be 1.5 to 3.5 W/mK.

The second layer 172 is disposed on the first layer 171 and comes into direct contact with the second metal substrate 180. The second layer 172 comes into direct contact with the first layer 171. In this case, since the second layer 172 has conductivity, heat generated from the P-type thermoelectric legs 140 and the N-type thermoelectric legs 150 is transferred to the second metal substrate 180 or external heat obtained from the second metal substrate 180 is transferred to the P-type thermoelectric legs 140 and the N-type thermoelectric legs 150.

The second layer 172 may include a matrix resin and a conductive filler. Here, the matrix resin may include a silicone resin, and may include, for example, polydimethylsiloxane (PDMS). In this case, the matrix resin applied to the second layer 172 may be the same as the matrix resin applied to the first layer 171. Further, the conductive filler may include metal powder such as silver (Ag)-based metal powder, gold (Au)-based metal powder, aluminum (Al)-based metal powder, or the like. Preferably, the metal powder may be included in an amount of 50 to 99 wt %. More preferably, the silver (Ag)-based metal powder may be included in an amount of 50 to 99 wt %. In this case, the thermal conductivity of the second layer 172 may be 6.0 to 10.0 W/mK.

Here, the first layer 171 and the second layer 172 may have adhesiveness or an adhesive property.

A thickness t1 of the first layer 171 may range from about 40 to 100 µm. In this case, when the thickness t1 of the first layer 171 is smaller than 40 µm, an insulation property is not secured, and thus there is a risk of electrical current, and when the thickness t2 of the first layer 171 increases to be larger than 40 µm, a phenomenon in which thermal conductivity decreases occurs, and thus the power generation performance of the thermoelectric element deteriorates. Further, a thickness t2 of the second layer 172 may range from 40 to 200 µm. That is, a ratio of the thickness t2 of the second layer 172 to the thickness t1 of the first layer 171 may be 0.2 to 2.5.

The second metal substrate 180 is disposed on the second resin layer 170 to face the first metal substrate 110. The second metal substrate 180 may be made of aluminum, an aluminum alloy, copper, or a copper alloy. Specifically, the second metal substrate 180 may be made of aluminum. In this case, as the second metal substrate 180 is disposed in the high-temperature region for power generation or a current is applied to the thermoelectric element, the second metal substrate 180 may be applied as a high-temperature portion due to the Peltier effect.

In this case, the surface roughness may be entirely or partially formed on a surface on which the second resin layer 170 is disposed, that is, a surface of the second metal substrate 180 facing the second resin layer 170 among both surfaces.

Here, each of the first metal substrate 110 and the second metal substrate 180 may have an area of 40 mm×40 mm to 200 mm×200 mm, and a thickness of 1 to 100 mm. In this case, the areas or thicknesses of the first metal substrate 110 and the second metal substrate 180 may be the same or may be different from each other.

FIG. 8 is a view illustrating a state in which the thermoelectric element according to the first embodiment of the present invention generates power.

Referring to FIG. 8, when the second metal substrate 180 of the thermoelectric element is disposed in the high-temperature region and the first metal substrate 110 is disposed in the low-temperature region, electricity is generated by movement of electrons between a plurality of serially connected thermoelectric legs by the Seebeck effect. In this case, a volume of the second metal substrate 180 exposed to a high temperature may expand due to heat. In this case, due to horizontal expansion of the second metal substrate 180, stress in a shear direction may be applied to the second resin layer 170. The shear stress may be transferred to the soldered portion of the second electrode 160 such that cracks are generated in the soldered portion, and durability at high temperatures may be degraded. In this case, the thermoelectric element according to the embodiment may secure the thickness of the second resin layer 170, and thus alleviate the shear stress transferred to a soldered joint, and secure durability at high temperatures. In this case, a width of the second resin layer 170 may increase in a horizontal direction of the second metal substrate 180 as the second resin layer 170 becomes closer to the second metal substrate 180. Meanwhile, although not shown in the drawings, it may be equally applied to thermal expansion which occurs when the second metal substrate 180 operates as the high-temperature portion due to the Peltier effect when a voltage is applied to the thermoelectric element.

Referring to FIGS. 5 and 6 again, the sealing means 190 may be disposed on a side surface of the first resin layer 120 and a side surface of the second resin layer 170. That is, the sealing means 190 may be disposed between the first metal substrate 110 and the second metal substrate 180, and may be disposed to surround the side surface of the first resin layer 120, the outermost side of the plurality of first electrodes 130, the outermost side of the plurality of P-type thermoelectric legs 140 and the plurality of N-type thermoelectric legs 150, the outermost side of the plurality of second electrodes 160, and the side surface of the second resin layer 170. Accordingly, the first resin layer 120, the plurality of first electrodes 130, the plurality of P-type thermoelectric legs 140, the plurality of N-type thermoelectric legs 150, the plurality of second electrodes 160, and the second resin layer may be sealed against external moisture, heat, and contamination.

Here, the sealing means 190 may include a sealing case 192 disposed to be spaced apart from the side surface of the first resin layer 120, the outermost side of the plurality of first electrodes 130, the outermost side of the plurality of P-type thermoelectric legs 140 and the plurality of N-type thermoelectric legs 150, the outermost side of the plurality of second electrodes 160, and the side surface of the second resin layer 170 by a predetermined distance, a sealing material 194 disposed between the sealing case 192 and the second metal substrate 180, and a sealing material 196 disposed between the sealing case 192 and the first metal substrate 110. Like the above, the sealing case 192 may come into contact with the first metal substrate 110 and the second metal substrate 180 through the sealing materials 194 and 196. Accordingly, when the sealing case 192 comes into direct contact with the first metal substrate 110 and the second metal substrate 180, heat conduction occurs through the sealing case 192, and accordingly, a problem in that ΔT decreases may be prevented.

Here, the sealing materials 194 and 196 may include at least one of an epoxy resin and a silicone resin, or a tape in which at least one of the epoxy resin and the silicone resin is applied on both side surfaces. The sealing materials 194 and 196 serve to seal between the sealing case 192 and the first metal substrate 110 and between the sealing case 192 and the second metal substrate 180, and may increase a sealing effect of the first resin layer 120, the plurality of first electrodes 130, the plurality of P-type thermoelectric legs 140, the plurality of N-type thermoelectric legs 150, the plurality of second electrodes 160, and the second resin layer 170, and may be interchanged with a finishing material, a finishing layer, a waterproofing material, a waterproofing layer, and the like.

Meanwhile, guide grooves G for drawing out wires W1 and W2 connected to the electrodes may be formed in the sealing case 192. To this end, the sealing case 192 may be an injection-molded product made of plastic or the like, and may be interchanged with a sealing cover.

Although a structure of the sealing means 190 is specifically illustrated, this is only an example, and the sealing means 190 may be modified into various forms.

Although not shown in the drawings, an insulating material may be further included to surround the sealing means 190. Alternatively, the sealing unit 190 may include an insulating component.

FIG. 9 is a cross-sectional view of a thermoelectric element according to a second embodiment of the present invention, FIG. 10 is a partially enlarged view of FIG. 9, and FIG. 11 is a view illustrating a state in which power is applied to the thermoelectric element according to the second embodiment of the present invention.

According to another embodiment of the present invention, a second resin layer 200 may include a plurality of layers. In this case, the plurality of layers numbers at least three or more, and may come into direct contact with each other. In this case, the number of layers included in the second resin layer 200 may be modified.

Referring to FIGS. 9 and 10, the second resin layer 200 includes first to fourth layers 201, 202, 203, and 204. In this case, the first to fourth layers 201, 202, 203, and 204 are made of different materials. Further, the first to fourth layers 201, 202, 203, and 204 may have different thermal conductivities. The first to fourth layers 201, 202, 203 and 204 are disposed in the order of higher thermal conductance from the first metal substrate 110 to the second metal substrate 180.

The first to fourth layers 201, 202, 203, and 204 may include a matrix resin and a conductive filler or an insulating filler. Here, the matrix resin may include a silicone resin, and may include, for example, polydimethylsiloxane (PDMS). In this case, the content of the conductive filler or the insulating filler included in the first to fourth layers 201, 202, 203, and 204 may be different.

Referring to FIG. 11, when the second metal substrate 180 of the thermoelectric element is disposed in the high-temperature region and the first metal substrate 110 is disposed in the low-temperature region, electricity is generated by movement of electrons between a plurality of serially connected thermoelectric legs by the Seebeck effect. In this case, a volume of the second metal substrate 180 exposed to a high temperature may expand due to heat. In this case, due to horizontal expansion of the second metal substrate 180, stress in a shear direction may be applied to the second resin layer 200. In this case, a width of the second resin layer 200 may increase in a horizontal direction of the second metal substrate 180 from the first layer 211 to the fourth layer 214. Although not shown in the drawings, it may be equally applied to thermal expansion which occurs when the second metal substrate 180 operates as the high-temperature portion due to the Peltier effect when a voltage is applied to the thermoelectric element.

Hereinafter, the present invention will be described in more detail through thermoelectric elements according to Examples and Comparative Examples. These examples are presented as only examples to describe the present invention in more detail. Accordingly, the present invention is not limited to these examples.

Results of both the thermoelectric element according to Comparative Example and the thermoelectric element according to Example are measurement results under a condition in which a temperature of 35° C. is applied to a first metal substrate region and a temperature of 200° C. is applied to a second metal substrate region in a 40 mm×40 mm power generation thermoelectric element including a first metal substrate, a first resin layer, a plurality of first electrodes, a plurality of P-type thermoelectric legs, a plurality of N-type thermoelectric legs, a plurality of second electrodes, a second resin layer, and a second metal substrate that are the same as the structure of FIG. 1. In the thermoelectric element according to Comparative Example, the second resin layer was entirely made of a resin having an insulating property, and in the thermoelectric element according to Example, the second resin layer was composed of a first layer and a second layer, the first layer was manufactured to have an insulating property, and the second layer was manufactured to have conductivity. At this time, a thickness of the first layer was fixed at 40 μm, and a thickness of the second layer was changed to measure a power generation amount and a reduction rate of the power generation amount of the thermoelectric element.

TABLE 1

| Second resin layer thickness (μm) | Comparative Example | | Example | |
|---|---|---|---|---|
| | Power generation amount (W) | Reduction rate of power generation amount (%, P/P$_0$) | Power generation amount (W) | Reduction rate of power generation amount (%, P/P$_0$) |
| 40 | 7.2 | — | 7.2 | — |
| 80 | 7.0 | 12 | 7.0 | 3 |
| 120 | 5.5 | 24 | 6.8 | 6 |
| 160 | 4.9 | 32 | 6.5 | 10 |
| 200 | 3.6 | 50 | 6.2 | 14 |

Referring to Table 1, in the thermoelectric element according to Comparative Example, it can be seen that the power generation amount decreases and the reduction rate of the power generation amount increases as the thickness of the second resin layer increases. Meanwhile, in the thermoelectric element according to Example, it can be seen that the power generation amount slightly decreases, and the reduction rate of the power generation amount increases as the thickness of the second resin layer increases, but the extent of the power generation amount reduction is significantly smaller extent compared to Comparative Example. That is, even when the thickness of the second resin layer is increased in order to alleviate thermal stress, the thermal conductance of the thermoelectric element according to Example does not significantly decrease, and sufficient power generation performance may be secured.

Hereinafter, still another embodiment of the present invention will be described with reference to FIGS. 12 to 14. The thermoelectric element according to the embodiment is substantially the same as the thermoelectric element in FIGS. 1 to 6 except for the second resin layer. Accordingly, components the same as those of the thermoelectric element in FIGS. 1 to 6 are denoted by the same reference numerals, and repeated descriptions will be omitted.

FIG. 12 is a cross-sectional view of a thermoelectric element according to a third embodiment of the present invention, FIG. 13 is a partially enlarged view of the thermoelectric element according to the third embodiment of the present invention, and FIG. 14 is a view illustrating a state in which the thermoelectric element according to the third embodiment of the present invention generates power.

Referring to FIGS. 12 and 13, a second resin layer 210 includes a first layer 211, a second layer 212, and a polyimide layer 213. In this case, the first layer 211 and the second layer 212 may have adhesiveness. For example, in the second resin layer, an adhesive layer may be formed on both surfaces of the polyimide layer.

Here, each of the first metal substrate 110 and the second metal substrate 180 may have an area of 40 mm×40 mm to 200 mm×200 mm, and a thickness of 1 to 100 mm. In this case, the areas or thicknesses of the first metal substrate 110 and the second metal substrate 180 may be the same or may be different from each other.

The first layer 211 comes into direct contact with the second electrode 160. More preferably, the first layer 211 may be a polysiloxane-based adhesive. In this case, the bonding strength of the first layer 211 decreases as an exposure temperature increases. That is, since the exposure temperature increases, a portion bonded to the second electrode 160 may be fluidly deformed while fluidity increases. Accordingly, even when shear stress is applied, the first layer 211 may block transfer of the shear stress to the second electrode 160 while the portion bonded to the second electrode 160 is fluidly pushed. In this case, the first layer 211 may have a bonding strength of 1 kgf/mm2 or less at a temperature of 150 to 200° C. Preferably, the first layer 211 may have a bonding strength of 0.5 kgf/mm2 or less at the temperature of 150 to 200° C., and more preferably, the first layer 211 may have a bonding strength of 0.1 kgf/mm2 or less at the temperature of 150 to 200° C.

The second layer 212 is stacked with and spaced apart from the first layer 211, and comes into direct contact with the second metal substrate 180. More preferably, the second layer 212 may be a polysiloxane-based adhesive. In this case, the bonding strength of the second layer 212 decreases as an exposure temperature increases. That is, since the exposure temperature increases, a portion bonded to the second metal substrate 180 may be fluidly deformed while fluidity increases. Accordingly, even when the second metal substrate 180 expands at a high temperature, application of the shear stress to the second metal substrate 180 may be blocked while the portion bonded to the second metal substrate 180 is fluidly pushed. In this case, the second layer 212 may have a bonding strength of 1 kgf/mm2 or less at a temperature of 150 to 200° C. Preferably, the second layer 212 may have a bonding strength of 0.5 kgf/mm2 or less at the temperature of 150 to 200° C., and more preferably, the second layer 212 may have a bonding strength of 0.1 kgf/mm2 or less at the temperature of 150 to 200° C.

The bonding strength of the second layer 212 may be higher than or equal to the bonding strength of the first layer 211.

The polyimide layer 213 is stacked between the first layer 211 and the second layer 212. In this case, one surface of the polyimide layer 213 comes into contact with an upper surface of the first layer 211 and the other surface of the polyimide layer 213 comes into contact with a lower surface of the second layer 212. The polyimide layer 213 has an insulating property and blocks the transmission of a current from the second electrode 160 to the second metal substrate 180. The polyimide layer 213 may be made of a polyimide-based material. In this case, instead of the polyimide layer, an insulating layer including another insulating material may be disposed. Meanwhile, a thickness t1 of the polyimide layer 213 may be 1 to 500 μm. As the thickness t1 of the polyimide layer 213 increases, since thermal conductance and a thermal breakdown voltage decrease, a risk of energization decreases. On the other hand, since the thermal conductivity of the polyimide layer 213 decreases as the thickness t1 increases, power generation performance tends to decrease.

The following Table 2 is a table showing breakdown voltage, thermal conductivity, and thermal conductance according to the thickness of the polyimide layer.

TABLE 2

| Polyimide layer thickness (um) | 5 | 7.8 | 12.3 | 25 | 37.5 | 50 |
|---|---|---|---|---|---|---|
| Breakdown voltage (kV) | 2.1 | 3.1 | 5.1 | 9.5 | 14.3 | 19.0 |
| Thermal conductivity (W/mK) | 0.18 | 0.18 | 0.16 | 0.16 | 0.16 | 0.16 |
| Thermal conductance (W/Km$^2$) | 3.60 | 2.31 | 1.30 | 0.64 | 0.43 | 0.32 |

Referring to Table 2, the thickness of the polyimide layer 213 may be approximately 5 um. In this case, it can be seen that the breakdown voltage increases and the thermal conductivity and thermal conductance decrease as the thickness of the polyimide layer increases. In this case, the breakdown voltage required by the thermoelectric element is less than 1 kV, and when the thickness of the polyimide layer is formed to be approximately 5 um, the high thermal conductance may be secured without damage due to overload.

Hereinafter, the present invention will be described in more detail through thermoelectric elements according to Examples and Comparative Examples with reference to Table 3 and FIG. 18. These examples are presented as only examples to describe the present invention in more detail. Accordingly, the present invention is not limited to these examples. The following Table 3 shows measurement results for a temperature cycle test of Example and Comparative Example, and FIG. 18 is a graph illustrating a change rate of resistance according to the number of cycles in the temperature cycle test of Example and Comparative Example.

Both the thermoelectric element according to Comparative Example and the thermoelectric element according to Example are 40 mm×40 mm power generation thermoelectric elements each including a first metal substrate, a first resin layer, a plurality of first electrodes, a plurality of P-type thermoelectric legs, a plurality of N-type thermoelectric legs, a plurality of second electrodes, a second resin layer, and a second metal substrate. Both the first resin layer and the second resin layer were made of a resin material having a bonding strength of 5 kgf/mm2 or more in the thermoelectric element according to Comparative Example, whereas the first resin layer was made of a resin material having a bonding strength of 5 kgf/mm2 or more, and the second resin layer was disposed as a polyimide-based film in which a polysiloxane-based adhesive layer was formed on both surfaces in the thermoelectric element according to Example.

In the temperature cycle test, performing a temperature increase step in which the temperature of the second metal substrate is changed from 50° C. to 180° C. and a temperature decrease step in which the temperature of the second metal substrate is changed from 180° C. to 50° C. while the temperature of the first metal substrate is maintained at 25° C. was referred to as one cycle, and a total of 5000 cycles were performed. In this case, a temperature increase rate in the temperature increase step is 30° C./min, and a temperature decrease rate in the temperature decrease step is 22° C./min.

Referring to Table 3 and FIG. 18, it was confirmed that the thermoelectric element according to Comparative Example had a significant increase in resistance and a significant decrease in power generation from 0 to 200 cycles, and a phenomenon of the thermoelectric element being destroyed occurred when 200 cycles were exceeded. On the other hand, in the thermoelectric device according to Example, all the resistance change rates were within 5% for 5000 cycles, and the power generation amount increased. Further, it was confirmed that the destruction phenomenon of the thermoelectric did not occur while maintaining 5000 cycles. That is, it can be seen that the thermoelectric element according to Example has stronger product durability due to a heat change and excellent power generation performance at a high temperature compared to the thermoelectric element according to Comparative Example.

Referring to FIG. 14, when the second metal substrate 180 of the thermoelectric element is disposed in the high-temperature region and the first metal substrate 110 is disposed in the low-temperature region, electricity is generated by movement of electrons between a plurality of serially connected thermoelectric legs by the Seebeck effect. In this case, a volume of the second metal substrate 180 exposed to a high temperature may expand due to heat. In this case, due to horizontal expansion of the second metal substrate 180, stress in a shear direction may be applied to the second resin layer 210. The shear stress may be transferred to the soldered portion of the second electrode 160 such that cracks are generated in the soldered portion, and durability at high temperatures is degraded. In this case, in the thermoelectric element according to the embodiment, the shear stress transferred to the soldered portion may be alleviated, and the durability at high-temperatures may be secured by configuring the second resin layer 210 with a material having adhesiveness, so that the second resin layer 210 is implemented to be fluidly pushed against the second metal substrate 180 even when the second metal substrate 180 expands at the high temperature. Although not shown in the drawings, it may be equally applied to thermal expansion which occurs when the second metal substrate 180 operates as the high-temperature portion due to the Peltier effect when a voltage is applied to the thermoelectric element.

Hereinafter, a fourth embodiment of the present invention will be described with reference to FIGS. 15 to 17. The thermoelectric element according to the embodiment is substantially the same as the thermoelectric element in FIGS. 12 to 14 except for the second resin layer. Accordingly, components the same as those of the thermoelectric element in FIGS. 12 to 14 are denoted by the same reference numerals, and repeated descriptions will be omitted.

TABLE 3

| Classification | Cycle number | 0 | 100 | 200 | 300 | 400 | 500 | 1000 | 2000 | 3000 | 4000 | 5000 |
|---|---|---|---|---|---|---|---|---|---|---|---|---|
| Comparative Example | Resistance change rate (%) | — | 13.3 | 21.7 | | | | | | | | |
| | Power generation amount change rate (%) | — | −23.5 | −46.1 | | | | | | | | |
| Example | Resistance change rate (%) | — | 0 | 0.5 | 0.5 | 0.9 | 0 | 1.6 | 0.3 | 0.6 | 2.4 | 4.1 |
| | Power generation amount change rate (%) | — | 6.84 | 8.49 | 9.47 | 9.84 | 10.25 | 11.76 | 12.13 | 12.17 | 12.27 | 12.07 |

FIG. 15 is a cross-sectional view of the thermoelectric element according to the fourth embodiment of the present invention, FIG. 16 is a partially enlarged view of FIG. 15, and FIG. 17 is a view illustrating a state in which power is applied to the thermoelectric element according to the fourth embodiment of the present invention.

Referring to FIGS. 15 and 16, a second resin layer 220 may include a plurality of layers, and a polyimide layer. In this case, the plurality of layers numbers at least three or more, and may come into direct contact with each other or come into direct contact with a polyimide layer 225. In this case, the number of layers included in the second resin layer 220 may be modified.

The second resin layer 200 includes first to fourth layers 221, 222, 223, and 224. In this case, the first to fourth layers 221, 222, 223, and 224 are made of different materials. Further, the first to fourth layers 221, 222, 223, and 224 may have different thermal conductivities. In addition, the first to fourth layers 221, 222, 223, and 224 are disposed in the order of higher thermal conductance from the first metal substrate 110 to the second metal substrate 180. In this case, the first layer 221 and the fourth layer 224 which respectively come into direct contact with the second electrodes 160 and the second metal substrate 180 may have adhesiveness.

The polyimide layer 225 is disposed at one position between the first to fourth layers 221, 222, 223, and 224. In the drawings, the polyimide layer 225 is disposed between the second layer 222 and the third layer 223, but the polyimide layer 225 may also disposed at a different position between the first to fourth layers 221,222,223, and 224. In this case, the polyimide layer 225 is made of an insulating material to block transmission of the current from the second electrode 160 to the second metal substrate 180. The polyimide layer 225 is more advantageous in blocking the current as the polyimide layer 225 is disposed adjacent to the second electrode 160, but the present invention is not limited thereto. In this case, the polyimide layer 225 may be made of a polyimide-based material. Further, the thickness of the polyimide layer 225 may be 1 to 500 μm. For example, a thickness of the polyimide layer 225 may be about 5 μm.

The thermoelectric element according to the embodiment of the present invention may be applied to a power generation device, a cooling device, a heating device, and the like. Specifically, the thermoelectric element according to the embodiment of the present invention may be mainly applied to an optical communication module, a sensor, a medical device, a measuring device, the aerospace industry, a refrigerator, a chiller, an automobile ventilation sheet, a cup holder, a washing machine, a dryer, a wine cellar, a water purifier, a power supply device for a sensor, a thermopile, and the like.

Here, as an example in which the thermoelectric element according to the embodiment of the present invention is applied to a medical device, there is a polymerase chain reaction (PCR) device. The PCR device is a device for amplifying deoxyribonucleic acid (DNA) to determine a nucleotide sequence of DNA and demands precise temperature control and requires a thermal cycle. To this end, a Peltier-based thermoelectric element may be applied.

As another example in which the thermoelectric element according to the embodiment of the present invention is applied to a medical device, there is a photodetector. Here, the photodetector includes an infrared/ultraviolet ray detector, a charge coupled device (CCD) sensor, an X-ray detector, a thermoelectric thermal reference source (TTRS), and the like. The Peltier-based thermoelectric element may be applied to cool the photodetector. Accordingly, it is possible to prevent a wavelength change, an output decrease, a resolution decrease, or the like due to a temperature increase in the photodetector.

As still another example in which the thermoelectric element according to the embodiment of the present invention is applied to a medical device, there is an immunoassay field, an in vitro diagnostics field, a general temperature control and cooling system, a physical therapy field, a liquid chiller system, a blood/plasma temperature control field, or the like. Accordingly, precise temperature control is possible.

As yet another example in which the thermoelectric element according to the embodiment of the present invention is applied to a medical device, there is an artificial heart. Accordingly, power may be supplied to the artificial heart.

As an example in which the thermoelectric element according to the embodiment of the present invention is applied to the aerospace industry, there is a star tracking system, a thermal imaging camera, an infrared/ultraviolet detector, a CCD sensor, a Hubble space telescope, a TTRS, or the like. Accordingly, it is possible to maintain the temperature of an image sensor.

As another example in which the thermoelectric element according to the embodiment of the present invention is applied to the aerospace industry, there is a cooling device, a heater, a power generation device, or the like.

In addition, the thermoelectric element according to the embodiment of the present invention may be applied to other industrial fields for power generation, cooling, and heating.

Although preferable embodiments of the present invention are described above, those skilled in the art may variously modify and change the present invention within a range not departing from the spirit and area of the present invention disclosed in the claims which will be described below.

REFERENCE NUMERALS

110: first metal substrate, 120: first resin layer, 130: first electrode, 140: P-type thermoelectric leg, 150: N-type thermoelectric leg, 160: second electrode, 180: second metal substrate, 190: sealing means, 170,200,210,220: second resin layer, 171,201,211,221: first layer, 172,202,212,222: second layer, 203,223: third layer, 204,224: fourth layer

The invention claimed is:
1. A thermoelectric element comprising:
a first metal substrate;
a first resin layer disposed on the first metal substrate;
a plurality of first electrodes disposed on the first resin layer;
a plurality of P-type thermoelectric legs and a plurality of N-type thermoelectric legs disposed on the plurality of first electrodes;
a plurality of second electrodes disposed on the plurality of P-type thermoelectric legs and the plurality of N-type thermoelectric legs;
a second resin layer disposed on the plurality of second electrodes; and
a second metal substrate disposed on the second resin layer,
wherein
the first metal substrate is a low-temperature portion,
the second metal substrate is a high-temperature portion,
the second resin layer includes a first layer which comes into direct contact with the plurality of second elec- trodes and a second layer which is disposed on the first layer and comes into direct contact with the second metal substrate, a thickness of the second resin layer is larger than or equal to a thickness of the first resin layer, the thermoelectric element further comprises a polyimide layer disposed between the first layer and the second layer, and the first layer and the second layer include a polysiloxane-based resin.

2. The thermoelectric element of claim 1, wherein the first layer and the second layer have a bonding strength of 1 kgf/mm² or less at a temperature of 150 to 200° C.

3. The thermoelectric element of claim 1, further comprising a third layer between the first layer and the polyimide layer.

4. The thermoelectric element of claim 3, further comprising a fourth layer between the second layer and the polyimide layer.

5. The thermoelectric element of claim 4, wherein the thermal conductivity of each of the first to fourth layers increases the closer each of the first to fourth layers is to the second metal substrate.

6. The thermoelectric element of claim 1, wherein a bonding strength of the first resin layer is greater than a bonding strength of the second resin layer.

* * * * *